United States Patent
Hindelang et al.

(10) Patent No.: US 7,051,269 B1
(45) Date of Patent: May 23, 2006

(54) METHOD FOR CHANNEL CODING

(75) Inventors: Thomas Hindelang, Munich (DE); Thomas Stockhammer, Bergen (DE); Wen Xu, Unterhaching (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/958,084

(22) PCT Filed: Apr. 5, 2000

(86) PCT No.: PCT/DE00/01055

§ 371 (c)(1),
(2), (4) Date: Oct. 4, 2001

(87) PCT Pub. No.: WO00/62425

PCT Pub. Date: Oct. 19, 2000

(30) Foreign Application Priority Data

Apr. 7, 1999 (DE) .......................................... 199 15 687

(51) Int. Cl.
*H03M 13/23* (2006.01)
*H03M 13/27* (2006.01)

(52) U.S. Cl. ....................................................... 714/790
(58) Field of Classification Search ................. 714/790
See application file for complete search history.

(56) References Cited

U.S. PATENT DOCUMENTS

| 6,000,054 A | * | 12/1999 | Bahr et al. | 714/786 |
| 6,023,783 A | * | 2/2000 | Divsalar et al. | 714/792 |
| 6,108,810 A | * | 8/2000 | Kroeger et al. | 714/790 |
| 6,334,197 B1 | * | 12/2001 | Eroz et al. | 714/701 |
| 6,339,834 B1 | * | 1/2002 | Crozier et al. | 714/701 |
| 6,370,669 B1 | * | 4/2002 | Eroz et al. | 714/774 |
| 6,385,752 B1 | * | 5/2002 | Li | 714/790 |
| 6,427,214 B1 | * | 7/2002 | Li et al. | 714/701 |
| 6,543,013 B1 | * | 4/2003 | Li et al. | 714/701 |

OTHER PUBLICATIONS

XP-002133421—"Turbo" Decoding with Unequal Error Protection applied to GSM speech coding—Burkert et al., pp. 2044–2048.

* cited by examiner

*Primary Examiner*—Stephen M. Baker
(74) *Attorney, Agent, or Firm*—Bell Boyd & Lloyd LLC

(57) ABSTRACT

A method for channel coding in a digital telecommunication system, the method having error protection coding and interleaving, a coherent puncturing and interleaving rule determined in a common calculation step being applied for puncturing of a predetermined error protection coding master code and the interleaving, the rule having been determined under the criterion of optimizing the distance properties after interleaving.

6 Claims, 2 Drawing Sheets

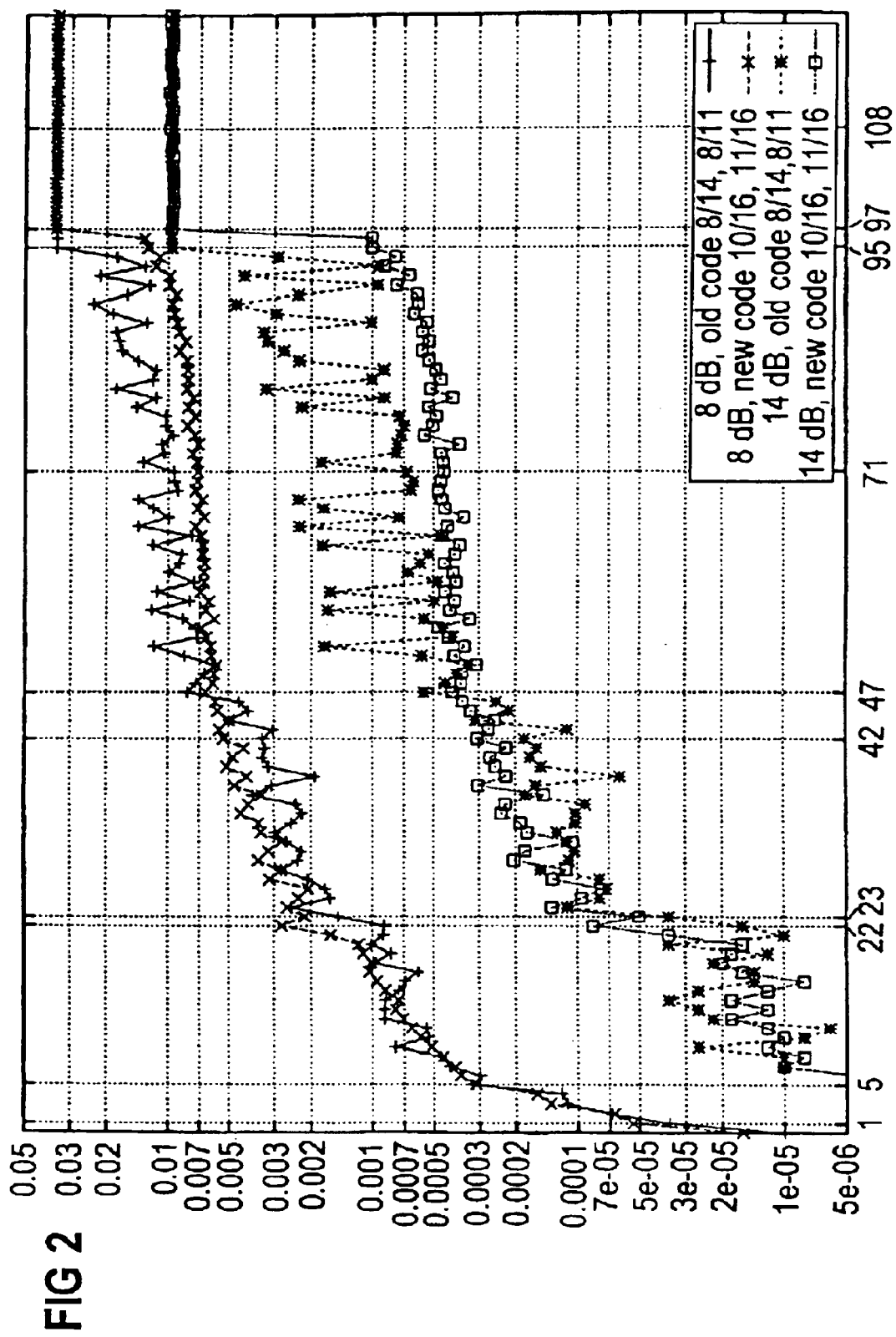

METHOD FOR CHANNEL CODING

BACKGROUND OF THE INVENTION

Modern digital telecommunication systems provide source coding of signals (for example, languages) with the aid of which compression of the signal is achieved such that a substantially lower bit rate than that of the (primary) digital signal suffices for transmission. Thus, in accordance with the system standard of the generally known GSM mobile radio system, the speech signal is sampled at the transmitter end at a rate of 8000 samples per second, the samples being represented with a resolution of 13 bits. This corresponds to a bit rate of 104 kbit/s per speech signal. The source or speech encoder compresses this speech signal to a source-coded speech signal with blocks of lengths 260 bits and a bit rate of 13 kbit/s. A compression of the speech signals by the factor 8, therefore, takes place.

The physical conditions in the case of wireless telecommunication, specifically in the frequency bands, available for mobile radio systems, under terrestrial conditions in the case of which there is multiple scattering and reflection on natural obstacles, lead to high and relatively strong fluctuating propagation losses and fading produced by multipath propagation (fast fading). In individual time sections (timeslots) of the transmission process, the transmission can thereby be strongly disturbed or even completely interrupted, while other timeslots are, by contrast, scarcely disturbed.

The useful datastream therefore, includes phases which either have a higher or lower bit error rate; that is, the errors occur in bursts, in particular.

Because of these circumstances, the transmission of the speech signal, which is highly compressed and reduced in redundancy by the source coding, will not be possible directly with acceptable quality. The bit error rate to be expected (of the order of magnitude of $10^{-3}$ to $10^{-1}$) is, therefore, to be reduced to acceptable values (of the order of magnitude of $10^{-3}$ to $10^{-6}$) by suitable error correction methods. This is the task of channel coding, which basically adds a (defined) redundancy once again to the source coded signals, which then permits the detection and correction of transmission errors on the transmission link (air interface).

In the method of the generic type, channel coding includes error protection coding (convolutional coding) and interleaving (also denoted as scrambling). Subsequently, the convolutionally coded and interleaved blocks are encrypted, mapped onto data bursts, modulated onto the carrier frequency, and transmitted.

It must be kept in mind for convolutionally coding that the source coded bits are not of equal relevance for the speech quality after decoding. Errors in some bits lead to substantial impairments of comprehensive validity, whereas errors and other bits are scarcely perceptible. The source coded bits are therefore split into pulses or groups, where each pulse or group is provided with a different error protection. Thus, in the case of GSM full-rate encodec (encoder/decoder for full rate transmission) they are the protection classes 1a, 1b, and 2.

A conventional method for implementing this different protection is what is termed "puncturation" or puncturing of the code following upon the error protection coding (convolutional code). Simply, the puncturation eliminates one or more positions from the output bit stream of the convolutional encoder in accordance with a prescribed scheme (a puncturation table). A puncturation table consists of elements 0 and 1, and is periodically processed, the bit corresponding to a 0 not being sent in the output bit stream, and the bit corresponding to a 1 being transmitted. The coded sequence is consequently shortened, and the error protection effect is weakened. Punctured codes have the advantage, however, of the implementability of various coding rates, codes with a higher coding rate being developed by periodic puncturation starting from a mother code of rate 1/n.

The fundamental sensitivity of the convolutional coding and decoding methods to errors occurring in bursts, such as those which constitute the main problem in the case of mobile radio connections, is still further sharpened by the puncturation such that punctured convolutional codes are applied virtually only in conjunction with subsequent nesting or interleaving. An approximately constant fading amplitude occurs within a timeslot in the case of typical mobile radio channels with the profiles TU (Typical Urban) or HT (Hilly Terrain) in the GSM system or in similarly profiled channels. If another channel is used for each new timeslot (ideal frequency hopping), the fading amplitude can be assumed to be statistically independent between two timeslots. Consideration as interleaving methods is given for this purpose to block interleaving or random interleaving, for example, which are known as such to the person skilled in the art.

The determination of effectively punctured convolutional codes likewise constitutes an important design task for a digital telecommunication transmission system of the type outlined above such as the selection and concrete configuration of the interleaving method to be applied in accordance with the error protection coding. Systematic instructive methods are not known for this purpose, and so it is necessary in order to find effectively punctured convolutional codes to conduct computer-aided testing of various codes and puncturings and compare them with one another with the aid of specific criteria which permit a statement on the likely transmission quality. It is typical, in this case, to presuppose that the interleaver is ideal ("infinitely deep").

It is an object of the present invention, therefore, to specify a method for channel coding which is improved with regard to the achievable transmission quality.

SUMMARY OF THE INVENTION

The present invention is thus directed toward applying, in channel coding, a coherent puncturation and interleaving rule, determined in a common calculation step, for puncturating an error protection coding mother code and for interleaving. A determination of this coherent puncturation and interleaving rule proceeds from the assumption of an ideal interleaver, and the configuration of the interleaving step is put from the very start into an indissoluble relationship with the finding of an advantageous puncturation rule (puncturation matrix or puncturation table).

The puncturation and interleaving rule is summarized, in particular in a predetermined set of subcodes and/or puncturation tables, or else in a combined puncturation and interleaving matrix or table. These are found in a computer-aided fashion observing the criterion of optimization of the distance properties, specifically the minimum free distance and/or the mean distance spectrum. These terms are to be understood as follows:

The minimum free distance $d_f$ of a code is the minimum Hamming distance which occurs between divergent paths.

The mean distance spectrum $\{a_d\}$ is given by $\{a_d\}=1/P\Sigma^\infty d=d_f a_d$, $a_d$ being the number of all paths; which, starting from P consecutive nodes, leave the zero path, meet each other again and, in so doing, build up the distance d and P being the number of columns in the puncturation matrix P, and thus specifying the period length of the puncturation.

The mean distance spectrum $\{C_d\}$ is given by $\{C_d\}=1/P\Sigma^{\infty}d=d_fC_d$, the information weight $C_d$ being the number of bits with the value 1 along all paths which, starting from P consecutive nodes, leave the zero path, meet again and in the process build up the distance d.

The bit error probability can be estimated for an AWGN (Additive White Gaussian Noise) channel or a fully-interleaved Rayleigh channel from the distance spectra. The optimum non-systematic non-recursive convolutional codes and systematic recursive convolutional codes for transmitting without puncturation at a rate of ½ and memory 2 via the above named channels are known.

Thus, in practice, a number of puncturation and interleaving matrices or tables are determined in a number of calculation steps using a computer in accordance with a number of algorithms, their distance properties are respectively determined in a weighting step in accordance with the partial criteria, and that puncturation and interleaving matrix or table is implemented in the channel coder which shows the most favorable result with regard to the bit error rate to be expected. It is particularly advantageous to apply the proposed method for a transmission channel with the profile mentioned further above, that is to say with an approximately constant fading amplitude within a timeslot, and to a transmission method in which each new timeslot is assigned another channel. The advantages come to bear, in particular, in the case of application to a speech transmission method with a high transmission rate. In the case of this method, it is assumed that the failure of a timeslot is an error event that occurs most frequently. Investigations have also confirmed this.

Additional features and advantages of the present invention are described in, and will be apparent from, the following Detailed Description of the Invention and the Figures.

BRIEF DESCRIPTION OF THE FIGURES

FIG. 2 shows comparative diagrams of bit error rates in the case of a conventional interleaver and an optimized interleaver.

BRIEF DESCRIPTION OF THE INVENTION

Figure 1:
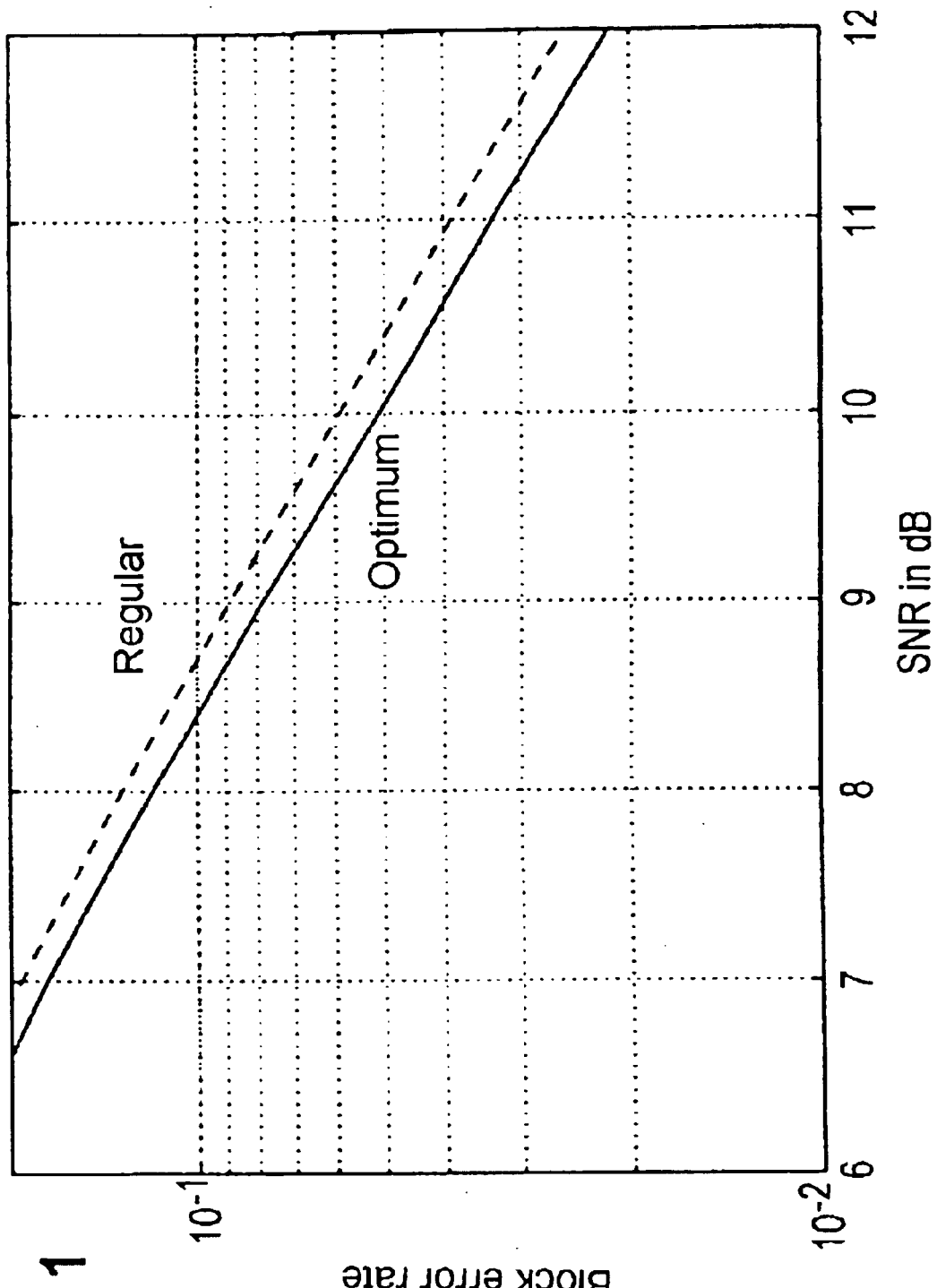
FIG. 1 shows comparative diagrams of block error rates of a half-rate channel for an interleaver determined by a conventional method and of an optimized interleaver.

A systematic, punctured code of rate R=11/16 is yielded by the puncturation of a mother code of rate ½ and memory m=4 with the aid of the generator polynomials $$G = \left[1 \frac{D^4+D^2+D+1}{D^4+D^3+1}\right] \quad (3.1)$$

The puncturation matrix, found via computer search, with the best distance properties is as follows:

$$P = \begin{bmatrix} 1 & 1 & 1 & 1 & 1 & 1 & 1 & 1 & 1 & 1 & 1 \\ 1 & 0 & 1 & 0 & 1 & 0 & 1 & 0 & 1 & 0 & 0 \end{bmatrix} \quad (3.2)$$

The period length P is 11 in this example. When selecting the punctured codes, it must be kept in mind that the number Z of ones in the puncturation matrix is an intger multiple of the number timeslots in order to be able to assign each timeslot the same number of bits. The interleaving assigns the bits of the matrix P to the timeslots. In the example, the half-rate channel is assumed, and the Z=16 bits are thereby split up into F=4 timeslots. The following combined puncturation and interleaving matrix is obtained if block interleaving (conventional independent interleaver) is applied:

$$P = \begin{bmatrix} 1 & 3 & 4 & 2 & 3 & 1 & 2 & 4 & 1 & 3 & 4 \\ 2 & 0 & 1 & 0 & 4 & 0 & 3 & 0 & 2 & 0 & 0 \end{bmatrix} \quad (3.3)$$

Elements of the matrix with the value 0 are punctured bits, and the values 1.4 assign the individual bits to the corresponding timeslots.

The failure of a block can now be regarded as a further puncturation; that is, all the bits of this block are ignored. The number of the lost bits is B=Z/F in the event of a block failure. A new subcode with the rate:

$R_u = P/Z-b$, results, P being the number of columns in the puncturation matrix P, and thus specifying the period length of the puncturation.

The interleaver determines the configuration of the subcode by assignment of the bits to the blocks of the channel. The selection of the interleaver must be done such that the subcodes resulting from block failure are optimum for the purpose of the described distance criteria. A third search must be carried out after the computer-aided search of the mother code of rate ½ and the punctured code of rate 11/16. F good puncturation matrices must be sought for the subcodes, their elements always being zero when the puncturation matrix of the mother code contains a zero at this point, and which may contain a zero at other positions only when no other matrix of a subcode is zero at this point. Each bit must be assigned to exactly one timeslot.

The following optimum subcodes of rate $R_u=11/12$ are yielded the assignment of the code of rate 11/16 to 4 timeslots.

$$P_{u1} = \begin{bmatrix} x & 1 & 1 & 1 & 1 & x & 1 & x & 1 & 1 \\ 1 & 0 & x & 0 & 1 & 0 & 1 & 0 & 1 & 0 & 0 \end{bmatrix}$$

$$P_{u2} = \begin{bmatrix} 1 & 1 & 1 & x & 1 & x & 1 & 1 & 1 & 1 \\ x & 0 & 1 & 0 & 1 & 0 & x & 0 & 1 & 0 & 0 \end{bmatrix}$$

$$P_{u3} = \begin{bmatrix} 1 & x & 1 & 1 & x & 1 & 1 & 1 & 1 & x \\ 1 & 0 & 1 & 0 & 1 & 0 & 1 & 0 & x & 0 & 0 \end{bmatrix}$$

$$P_{u4} = \begin{bmatrix} 1 & 1 & x & 1 & 1 & 1 & x & 1 & x & 1 \\ 1 & 0 & 1 & 0 & x & 0 & 1 & 0 & 1 & 0 & 0 \end{bmatrix}$$

These submatrices can be summarized to form the combined puncturation and interleaver matrix:

$$P^* = \begin{bmatrix} 1 & 3 & 4 & 2 & 3 & 2 & 1 & 4 & 1 & 4 & 3 \\ 2 & 0 & 1 & 0 & 4 & 0 & 2 & 0 & 3 & 0 & 0 \end{bmatrix}$$

This matrix differs from that of the block interleaver from (3.3). The distance properties are better than those of the block interleaver. The distance spectra of the individual puncturation matrices of the subcodes are added in order to determine the optimum code.

TABLE 3.1

Free distance and distance spectrum of the punctured code of rate 11/16.

| $d_f = 4$ | $a_4 = 6$ | $c_4 = 18$ | $a_5 = 34$ | $c_5 = 132$ |
|---|---|---|---|---|

TABLE 3.2

Free distance and distance spectrum of the subcodes of rate 11/12.

| | | | | | |
|---|---|---|---|---|---|
| Code with $P_{u1}$: | $d_f = 2$ | $a_2 = 6$ | $c_2 = 21$ | $a_3 = 112$ | $c_3 = 556$ |
| Code with $P_{u2}$: | $d_f = 2$ | $a_2 = 4$ | $c_2 = 15$ | $a_3 = 78$ | $c_3 = 441$ |
| Code with $P_{u3}$: | $d_f = 2$ | $a_2 = 4$ | $c_2 = 16$ | $a_3 = 106$ | $c_3 = 661$ |
| Code with $P_{u4}$: | $d_f = 2$ | $a_2 = 6$ | $c_2 = 26$ | $a_3 = 132$ | $c_3 = 807$ |
| Sum | | 20 | 78 | 428 | 2465 |

By comparison therewith, in the case of the block interleaver there exists a subcode with a minimum distance $d_f=1$. This leads to a higher error rate.

FIG. 1 compares the block error rates of the half-rate channel for the interleaver determined by the conventional method (dashed line, denoted by "regular") and of the optimized interleaver, described by the combined puncturation and interleaver matrix according to equation (3.5), (continuous line, denoted by "optimum"). Even in this simple example, a gain of 0.3 dB results, which can be implemented without additional outlay at the decoder end.

FIG. 2 shows a comparison of the bit error rates in the case of a conventional interleaver (block interleaver—see in FIG. 2 the curves denoted by "old code") and an optimized interleaver (see in FIG. 2 the curves denoted by "new code"). FIG. 2 relates to a half-rate channel for the rate 8.1 kbit/s ("mode 3 H"), and the code rates specified in the box, and shows the bit error rate plotted against the bit number.

In this case, the following rates were used to code in order to achieve an unequal error protection:

TABLE 1

Rates of the mode 3H with block and optimized interleaver

| Block interleaver | | | | | | | |
|---|---|---|---|---|---|---|---|
| Block interleaver | Bit No. | 0.1 | 2.5 | 6.23 | 24.47 | 48.95 | 96.163 |
| | Number | 2 | 4 | 18 | 24 | 48 | 68 |
| | Rate | 1/3 | 2/5 | 1/2 | 8/14 | 8/11 | 1 |
| Optimum interleaver | Bit No. | 0.1 | 2.5 | 6.22 | 23.42 | 43.97 | 98.163 |
| | Number | 2 | 4 | 17 | 20 | 55 | 66 |
| | Rate | 1/3 | 2/5 | 1/2 | 10/16 | 11/16 | 1 |

Investigations by the present inventors have shown that the gain which can be achieved with the aid of the proposed method is greater the higher the rate of the code. Again, increasing the number Z of bits which are combined leads to an improvement in the distance properties, and thus to a reduction in the bit error rate to be expected.

Although the present invention has been described with reference to specific embodiments, those of skill in the art will recognize that changes may be made thereto without departing from the spirit and scope of the invention as set forth in the hereafter appended claims.

What is claimed is:

1. A method for channel coding of speech signals for speech transmission in a mobile radio system, the method including error protection coding and interleaving, the method comprising:
    determining a coherent puncturing and interleaving rule with a common calculation, the rule being determined under a criterion of optimizing distance properties after interleaving; and
    applying the rule for puncturing of a predetermined error protection coding mother code and for the interleaving,
    wherein the coherent puncturing and interleaving rule is applied as one of a set of subcodes and puncturing tables.

2. A method for channel coding as claimed in claim 1, wherein the method is applied to a speech transmission method with blockwise coding and with division of frames into a plurality of timeslots.

3. A method for channel coding of speech signals for speech transmission in a mobile radio system, the method including error protection coding and interleaving, the method comprising:
    determining a coherent puncturing and interleaving rule with a common calculation, the rule being determined under a criterion of optimizing distance properties after interleaving; and
    applying the rule for puncturing of a predetermined error protection coding mother code and for the interleaving,
    wherein the coherent puncturing and interleaving rule is applied as one of a combined puncturing and interleaving matrix and a table.

4. A method for channel coding of speech signals for speech transmission in a mobile radio system, the method including error protection coding and interleaving, the method comprising:
    determining a coherent puncturing and interleaving rule with a common calculation, the rule being determined under a criterion of optimizing distance properties after interleaving; and
    applying the rule for puncturing of a predetermined error protection coding mother code and for the interleaving;
    determining a plurality of coherent puncturation and interleaving rules in a plurality of common calculation steps using a plurality of predefined algorithms;
    performing a weighting step for determination of at least one of a free distance and a mean distance spectrum, and using the spectrum to determine associated distance properties; and
    applying the coherent puncturation and interleaving rule in channel coding which supplies at least one of a most favorable free distance and a most favorable distance spectrum.

5. A method for channel coding of speech signals for speech transmission in a mobile radio system, the method including error protection coding and interleaving, the method comprising:
    determining a coherent puncturing and interleaving rule with a common calculation, the rule being determined under a criterion of optimizing distance properties after interleaving; and
    applying the rule for puncturing of a predetermined error protection coding mother code and for the interleaving,
    wherein the method is applied to a transmission channel with an approximately constant fading amplitude within a time slot, and a transmission method in which each new time slot is assigned another channel.

6. A method for channel coding of speech signals for speech transmission in a mobile radio system, the method including error protection coding and interleaving, the method comprising:

determining a coherent puncturing and interleaving rule with a common calculation, the rule being determined under a criterion of optimizing distance properties after interleaving; and applying the rule for puncturing of a predetermined error protection coding mother code and for the interleaving, wherein the method is applied to a transmission channel with main error event extinction within a timeslot.

* * * * *